United States Patent [19]

Taylor, Jr.

[11] Patent Number: 4,987,051

[45] Date of Patent: Jan. 22, 1991

[54] IMAGE-REVERSAL PROCESS USING PHOTOSENSITIVE PEEL-APART ELEMENTS

[75] Inventor: Harvey W. Taylor, Jr., Sayre, Pa.

[73] Assignee: E. I. Du Pont de Nemours and Company, Wilmington, Del.

[21] Appl. No.: 391,785

[22] Filed: Aug. 9, 1989

[51] Int. Cl.$^5$ .................. G03C 3/00; G03C 11/12; G03C 1/805

[52] U.S. Cl. ................................ 430/253; 430/257; 430/258; 430/260; 430/263; 430/293

[58] Field of Search ............... 430/257, 258, 143, 293, 430/252, 253, 254, 292, 262

[56] References Cited

U.S. PATENT DOCUMENTS 4,489,154 12/1984 Taylor .................. 430/253

*Primary Examiner*—Paul R. Michl
*Assistant Examiner*—John S. Y. Chu

[57] ABSTRACT

This invention relates to an image reproduction process, more particularly a color proofing process, which utilizes a peel-apart photosensitive element comprising a strippable coversheet, a photohardenable layer, an elastomeric layer, and a support, to produce a positive image of the transparency on the coversheet and a negative image of the transparency on the elastomeric layer.

17 Claims, No Drawings

IMAGE-REVERSAL PROCESS USING PHOTOSENSITIVE PEEL-APART ELEMENTS

FIELD OF THE INVENTION

This invention relates to an image reproduction process particularly useful for color proofing applications. More particularly it relates to a process which uses a peel-apart photosensitive element comprising a strippable coversheet, a photohardenable layer, an elastomeric layer, and a support, to produce a positive image of the exposure transparency on the coversheet and a negative image of the exposure transparency on the elastomeric layer.

BACKGROUND OF THE INVENTION

Photosensitive elements which can be used in image-reproduction processes are well-known in the graphics arts industry. Such elements are exposed to actinic radiation through an image-bearing transparency, such as a color separation transparency, to produce an image which is either positive or negative with respect to the transparency used. Positive-working elements produce a duplicate image with respect to the transparency through which they are exposed. Negative-working elements produce an image that is the reverse of the transparency through which they are exposed.

After imagewise exposure, the photosensitive elements may be developed by washout of soluble image areas, toning of tacky image areas with a colorant, peeling apart of photoadherent layers, or combinations of these techniques. The resulting image-bearing photosensitive elements are particularly useful for color proofing applications. A useful reference for color proofing methods is *Principles of Color Proofing*, by Michael H. Bruno, GAMA Communications, Salem, NH, 1986.

In Cohen and Fan, U.S. Pat. No. 4,282,308 there is described a negative-working photosensitive element which is capable of producing colored images by a dry process without the need for toning with a colorant. The element comprises, in order from top to bottom, a strippable coversheet, a photoadherent layer containing a colorant, a tacky essentially nonphotosensitive elastomeric layer, and a support. After imagewise exposure to actinic radiation through the coversheet, the element can be developed by peeling off the coversheet. The exposed image areas of the colored photoadherent layer adhere to and are removed with the cover sheet. The unexposed areas of the colored photoadherent layer remain on the supported elastomeric layer.

When the imagewise exposure is through a negative transparency, and the exposed element is peeled apart, a positive image is obtained on the peeled-off coversheet and a negative image is obtained on the supported elastomeric layer. Imagewise exposure through a positive transparency, followed by peeling apart of the element, yields a negative image on the peeled-off coversheet and a positive image on the supported elastomeric layer.

Taylor, U.S. Pat. No. 4,489,154, describes a dry process for preparing a surprint proof without the need for toning with a colorant. This process uses an imagewise exposed, peel-apart photosensitive element comprising a strippable coversheet; a photoadherent layer containing a colorant; an essentially nonphotosensitive elastomeric layer; and a support. After exposure to actinic radiation through a positive image, e.g., a positive separation transparency, and peeling off the coversheet, a positive colored photoadherent image remains on the supported elastomeric layer. This image is then adhered to a substrate. By repeating this process with different colored photosensitive elements, a multicolored surprint proof can be built up on the substrate. If exposure is through a negative image, e.g., a negative separation transparency, a positive image is obtained on the coversheet.

It is sometimes desired to have a process which produces an image which is the reverse of that described above, i.e., after exposure the areas which are not imagewise exposed adhere to the coversheet rather than to the elastomeric layer so that these areas are removed with the coversheet, and the imagewise exposed areas remain on the elastomeric layer. If the element were precolored, imagewise exposure through a positive separation transparency would produce a positive overlay proof directly on the coversheet. As defined herein, a positive overlay proof is an overlay proof produced from a positive separation transparency. The precolored element would also be particularly useful for the preparation of negative-working, multicolor surprint proofs without the use of toners and which do not require the additional complication of an image transfer step and the addition of an adhesive layer.

While it may be possible to change the adhesive relationship of the unexposed and exposed photohardenable layer with respect to the other layers of the element, this is not an easy task. The multilayer peel-apart photosensitive element requires a very exacting balance of adhesive/cohesive forces in order to function properly. The addition or the substitution of new chemicals for ones previously used may indeed change the relative adhesive/cohesive properties but may, at the same time, adversely affect other important properties of the system. It is, therefore, desirable to achieve image reversal by alteration of the imaging process.

SUMMARY OF THE INVENTION

In one embodiment of this invention there is provided a process for preparing a precolored image useful in a pre-press color proof of the overlay type, said process comprising:
(A) providing a precolored, peel-apart photosensitive element comprising, in order from top to bottom:
  (1) a strippable coversheet which is transparent to actinic radiation,
  (2) a photohardenable layer comprising a colorant;
  (3) an essentially non-photosensitive elastomeric layer; and
  (4) a support sheet;
(B) peeling off the coversheet;
(C) exposing the element, minus the coversheet, to actinic radiation in an imagewise manner;
(D) laminating the coversheet to the exposed element so that the side of the coversheet originally in contact with the photohardenable layer is again in contact with the photohardenable layer;
(E) exposing the element overall to actinic radiation; and
(F) peeling off the coversheet, whereby the areas of the photohardenable layer exposed in step (C) remain on the elastomeric layer and the areas of the photohardenable layer not exposed in step (C) remain on the coversheet.

In a preferred embodiment of the foregoing process, imagewise exposure is through an image-bearing transparency, more preferably a color-separation positive. In a preferred embodiment of this invention a plurality of color-separation transparencies is used, each transparency in conjunction with its corresponding precolored, photosensitive element, to form a plurality of precolored, positive overlay images on transparent coversheets. These positive overlay images are stacked in register to form a multicolored positive overlay proof. In a still more preferred embodiment of this invention the precolored photosensitive elements are colored yellow, magenta, cyan, and black.

In another embodiment of this invention there is provided a process for preparing a precolored, pre-press proof of the surprint type, said process comprising:

(A) providing a precolored, peel-apart photosensitive element comprising, in order from top to bottom:
  (1) a strippable coversheet which is transparent to actinic radiation,
  (2) a photohardenable layer comprising a colorant;
  (3) an essentially non-photosensitive elastomeric layer; and
  (4) a removable support sheet;
(B) removing the removable support sheet and adhering the element, minus the removable support, to a receptor sheet (5);
(C) peeling off the coversheet;
(D) exposing the element, comprising the photohardenable layer (2), the elastomeric layer (3), and the receptor (5), to actinic radiation in an imagewise manner;
(E) laminating the coversheet to the photohardenable layer of the exposed element so that the side of the coversheet originally in contact with the photohardenable layer is again in contact with the photohardenable layer;
(F) exposing the element overall to actinic radiation; and
(G) peeling the coversheet from the photohardenable layer, whereby the photohardened material in the areas imagewise exposed in step (D) remain on the elastomeric layer and the material in the areas of the photohardenable layer not exposed in step (D) remain on the coversheet.

In a preferred embodiment of this invention the imagewise exposure is carried out through an image-bearing transparency, preferably through a color-separation negative. In a preferred embodiment of this invention the removable support sheet is removed from another, differently precolored photohardenable element, and the element, minus the removable support, is laminated on top of the image formed on the elastomeric layer in step (G). Then the process of steps (C)–(G) is repeated, with the imagewise exposure of the element in step (D) carried out in register through the corresponding color-separation transparency. This process is repeated a plurality of times with a plurality of differently colored elements to produce a multicolored surprint proof. In a still more preferred embodiment of this invention, the precolored peel-apart elements are colored yellow, magenta, cyan, and black.

DETAILED DESCRIPTION OF THE INVENTION

The invention relates to a dry process for preparing a, colored image on a photosensitive element, without the need for toning with a colorant. The image produced is the reverse of that described in Taylor, U.S. Pat. No. 4,489,154; i.e., the areas which are not imagewise exposed adhere to the coversheet rather than to the elastomeric layer so that these areas are removed with the coversheet, and the imagewise exposed areas remain on the elastomeric layer. This process uses a peel-apart photosensitive element comprising a strippable coversheet, a photohardenable layer containing a colorant, an elastomeric layer, and a support.

Surprisingly, it is possible to remove, i.e., strip off, the coversheet, imagewise expose the uncovered element, relaminate the coversheet to the element in the manner described, blanket-wise expose the element, peel the coversheet from the element, and achieve thereby, a reversed image. Surprisingly, the photohardenable layer does not stick to the color separation transparency after imagewise exposure. Even more surprisingly, image reversal is achieved with the described process, but not with a similar process wherein the coversheet is relaminated to the element with the previously exterior side in contact with the photohardenable layer. Similarly, a sheet of coversheet-like material not previously adhered to a photohardenable element cannot be used to achieve image reversal in the process of the invention.

Exposure/Image Formation

In using the processes of this invention to prepare positive overlay proofs from conventional halftone positive color separation transparencies, the coversheet is peeled off of the precolored photosensitive element. Then the precolored photosensitive element, minus the coversheet, is exposed to actinic radiation through the positive separation transparency. It is preferred that exposure take place in a vacuum frame under a vacuum that is somewhat less than the maximum. As is well known to those skilled in the art, under these conditions a somewhat longer exposure time will be required since oxygen inhibits photopolymerization.

The coversheet is then relaminated to the imagewise exposed element. It is essential that either the coversheet which was removed originally from the imagewise exposed element prior to exposure or a coversheet removed from a similar element be laminated to the imagewise exposed element as described above. The coversheet must be relaminated to the element so that the side of the coversheet which was originally in contact with the photohardenable layer is again in contact with the photohardenable layer. It is also essential that relamination be carried out in such a fashion that the relaminated coversheet adheres smoothly and evenly to the element, with no air bubbles remaining between the coversheet and the photohardenable layer following relamination. Relamination is preferably carried out with a Cromalin ® laminator (manufactured by Du Pont, Wilmington, DE), or a similar laminator, at 230° C. (110° C.). Relamination of the coversheet should be carried out within eight hours, preferably within two hours, following removal.

The relaminated, imagewise exposed element is then blanket-wise, i.e., overall or non-imagewise, exposed. It is preferred that the blanket-wise exposure be carried out in a vacuum frame using the maximum available vacuum. Following blanket-wise exposure, the coversheet is removed from the element at room temperature by stripping with a smooth, moderate-to-rapid continuous motion. The areas which were not exposed in the imagewise exposure but were exposed in the blanket-wise exposure remain on the coversheet to form a single color, precolored overlay proof. To form multicolor overlay proofs, this sequence of steps may be repeated several times as desired, using differently precolored photosensitive elements and their corresponding halftone positive color separation transparencies. The resulting overlay images are stacked in register for viewing.

In using the processes of this invention to prepare negative surprint proofs from conventional negative halftone color separation transparencies, a precolored photosensitive element having a removable support is used. The removable support is removed from an element, and the element minus the removable support, is adhered to a receptor sheet. The coversheet is removed from the resulting composite structure, and this composite structure, minus the coversheet, is exposed to actinic radiation through a negative separation transparency as described above. The coversheet is then relaminated to the imagewise-exposed composite structure as described above and the relaminated composite structure is blanket-wise exposed to actinic radiation as described above. The coversheet is then stripped from the blanket-wise exposed, relaminated composite structure at room temperature with a smooth, moderate-to-rapid continuous motion. The areas which were exposed during the imagewise exposure remain on the elastomeric layer to form a single color image useful in a surprint proof.

To form a multicolor surprint proof, a second element, minus its removable support, is adhered to the first image thus prepared. The coversheet is removed and the resulting composite element is exposed in register through a negative separation transparency. The coversheet is relaminated to the element, the element blanket-wise exposed, and the coversheet removed again as described above. This sequence of steps may be repeated several times using differently precolored photosensitive elements and their corresponding halftone positive color separation transparencies.

The receptor sheet is a material which is flat and preferably smooth, for example: films, e.g., polyethylene terephthalate of photographic grade which may be subbed as described in Alles U.S. Pat. No. 2,779,684; adhesive subbed opaque polyethylene terephthalate film base, e.g., Melinex ® 994, sold by I.C.I. Americas, Wilmington, De.; and paper stock, e.g., Kromekote ® opaque white paper, Champion Paper Co., Stamford, Conn, or Cromalin ® receptor stock, E. I. Du Pont, Wilmington, De. The preferred material is an opaque white paper.

Any convenient source or sources of actinic radiation providing wavelengths in the region of the spectrum that overlap the absorption bands of the photoinitiator system can be used to activate photohardening/photopolymerization. By "actinic radiation" is meant radiation which is active to produce the free-radicals necessary to initiate polymerization of the monomeric material or otherwise initiate photohardening. The radiation can be natural or artificial, monochromatic or polychromatic, incoherent or coherent, and for high efficiency should correspond closely in wavelengths to the absorption bands of the photoinitiator system. Conventional light sources include fluorescent lamps, mercury, mercury-xenon, metal additive and arc lamps. Useful coherent light sources are lasers whose emissions fall within or overlap the absorption bands of the photoinitiator system.

At the present time imagewise exposure in the process of the invention is ordinarily carried out through a halftone image-bearing photographic transparency, preferably a halftone color separation transparency, as described in the examples. It is recognized however that other means, such as a modulated scanning laser beam, CRT (cathode ray tube), and the like, are alternative ways of imagewise exposing in the process of the invention.

Photohardenable Layer

The photohardenable layer, which is the sole photosensitive layer of the element, is one whose adhesive relationship vis-a-vis the coversheet and the elastomeric layer is altered by exposure to actinic radiation. Before exposure, the photohardenable layer adheres more strongly to the elastomeric layer than to the coversheet. If the unexposed element is peeled apart, the photohardenable layer remains on the elastomeric layer. After imagewise exposure of the element with the coversheet in place, the exposed areas of the photohardenable layer adhere more strongly to the coversheet than to the elastomeric layer and are removed with the coversheet. The unexposed (i.e., unphotohardened) areas of the photohardenable layer adhere more strongly to the elastomeric layer than to the coversheet, and will remain on the elastomeric layer when the coversheet is peeled off. However, if the photohardenable layer is exposed in the absence of the coversheet and the coversheet is relaminated to the exposed element, the exposed photohardenable layer will adhere more strongly to the elastomeric layer than to the relaminated coversheet, so that it remains on the elastomeric layer if the coversheet is again peeled off. The photohardenable layer, either before or after exposure, must adhere more strongly to the elastomeric layer than to a color separation transparency placed directly on the photohardenable layer. When the color separation transparency is removed following exposure (in the absence of a coversheet), the photohardenable layer must not adhere to the transparency.

Initiator Systems

The initiator system comprises one or more compounds which directly furnish free radicals when activated by actinic radiation. It can also comprise a plurality of compounds, one of which yields the free radicals after having been caused to do so by another compound, or sensitizer, which has been activated by the radiation. By "actinic radiation" is meant radiation which is active to produce the free radicals necessary to initiate polymerization of the monomeric material.

Preferred initiator systems are 2,4,5-triphenylimidazolyl dimers in combination with chain transfer agents, or hydrogen donors, and mixtures thereof, as described in U.S. Pat. Nos. 3,427,161; 3,479,185; 3,549,367; 4,311,783; 4,622,286; and 3,784,557. Useful 2,4,5-triarylimidazolyl dimers are disclosed in Baum et al., U.S. Pat. No. 3,652,275, Col. 5, l. 44 to Col. 7, l. 16. Preferred hexaarylbisimidazoles (HABI's) are 2-o-chlorosubstituted hexaphenylbiimidazoles in which the other positions on the phenyl radicals are unsubstituted or substituted with chloro, methyl or methoxy. The most preferred initiator is o-Cl-HABI, i.e., 1,1'-biimidazole, 2,2'-bis (o-chlorophenyl)-4,4',5,5'-tetraphenyl-, which is typically used with a hydrogen donor.

Sensitizers useful with these photoinitiators include methylene blue, as well as sensitizers disclosed in U.S. Pat. Nos. 3,554,753; 3,563,750; 3,563,751; 3,647,467; 3,652,275; 4,162,162; 4,268,667; 4,351,893; 4,454,218;

4,535,052; and 4,565,769. For some applications, such as color proofing, the use of sensitizing dyes, especially those whose absorption extends well into the visible region of the spectrum, may be undesirable since such dyes may affect the color of the resulting image. A preferred sensitizer is 7-diethylamino-4-methylcoumarin.

Hydrogen donor compounds useful as chain transfer agents in the photopolymer compositions include: 2-mercaptobenzoxazole; 2-mercaptobenzothiazole; 4-methyl-4H-1,2,4-triazole-3-thiol; and the like, as well as various types of compounds, e.g., (a) ethers, (b) esters, (c) alcohols, (d) compounds containing allylic or benzylic hydrogen, (e) acetals, (f) aldehydes, and (g) amides as disclosed in Col. 12, lines 18 to 58 of MacLachlan, U.S. Pat. No. 3,390,996, the teaching of which is hereby incorporated by reference. A preferred hydrogen donor is 2-mercaptobenzoxazole.

Although the HABI initiating systems described above are preferred, they are also many other initiating systems which may be used in the practice of this invention. Typical free radical-generating addition polymerization initiators include: quinones; ketones, such as Michler's ketone and benzophenone; dialkylamino benzaldehyde; benzaldehyde; dialkylamino benzoate esters; and combinations thereof. Other useful photoinitiators, described in U.S. Pat. No. 2,760,863, include vicinal ketaldonyl alcohols, such as benzoin, pivaloin, acyloin ethers, e.g., benzoin methyl and ethyl ethers; alpha-hydrocarbon-substituted aromatic acyloins, such as alpha-methylbenzoin.

Redox systems, such as those involving dyes, e.g., Rose Bengal/2-dibutylaminoethanol, may be used. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487. For some applications, such as color proofing, the use of dye-based initiator systems, especially those which use dyes whose absorption extends well into the visible region of the spectrum, may be undesirable since such dyes may affect the color of the resulting image.

Monomers/Binders

Materials with ethylenically unsaturated groups which are photohardenable, photopolymerizable, photocrosslinkable, and/or photodimerizable, are used in the photohardenable layer, and are "photohardenable" within the meaning of this application. Such materials are described, for example, in Chu et al., U.S. Pat. No. 3,649,268. The preferred photohardenable compositions are photopolymerizable, and comprise a macromolecular organic polymeric binder and an addition polymerizable ethylenically unsaturated monomer. The binder can be a polar material, such as an acidic polymer containing at least 1.5 mole percent free acid groups to impart polarity to the polymer, or a nonpolar material, e.g., materials as described in Burg et al., U.S. Pat. No. 3,060,023; Chu et al., U.S. Pat. No. 3,649,268 and Collier et al., U.S. Pat. No. 3,984,244. The monomer has at least one and preferably two or more terminal ethylenically unsaturated groups capable of free-radical initiated, chain propagated, addition polymerization, and preferably has some degree of polarity. In addition, the monomer must be compatible with the binder and substantially nondiffusible in the elastomeric layer. Compatibility means that the monomer/binder mixture shows no evidence of phase separation, e.g., haze, in the coated and dried layer.

Useful monomers are epoxy monomers containing ethylenic unsaturation, such as are disclosed in U.S. Pat. No. 3,661,576 and British Pat. No. 1,006,587. A preferred monomer is the methacrylate ester of the epichlorohydrin adduct of bis-phenol A.

Suitable binders include polymers of methyl acrylate, methyl methacrylate, and copolymers thereof. A preferred binder is poly(methyl methacrylate).

Colorants

The photohardenable layer is precolored by colorant. Examples of suitable colorants include:

yellow: Cromophtal ® Yellow 3G (C.I. No. Pigment Yellow 93), Hostaperm ® Yellow 3G (C.I. No. Pigment Yellow 154);

magenta: Monastral ® Violet R (C.I. No. Pigment Violet 19), 2,9-Dimethylquinacridone (C.I. No. Pigment Red 122), Indofast ® Brilliant Scarlet R6300 (C.I. No. Pigment Red 123), Quindo Magenta RV 6803;

cyan: Monastral ® Blue G (C.I. No. Pigment Blue 15), Monastral ® Blue (BT 383D) (C.I. No. Pigment Blue 15), Monastral ® Blue G (BT 284D) (C.I. No. Pigment Blue 15), Monastral ® Green GT (751D) (C.I. No. Pigment Green 7);

black: Raven ® 450 (C.I. No. Pigment Black 7), Raven ® 1035 (C.I. No. Pigment Black 7), Elftex ® 8 (C.I. No. Pigment Black 7), Elftex ® 12 (C.I. No. Pigment Black 7).

If other colors are desired, other colorants, compatible with the other ingredients present in the photohardenable layer may be used provided that they do not alter the unique relationship between the elastomeric layer, the unexposed photohardenable layer, the photohardenable layer exposed in the absence and in the presence of a coversheet, and the coversheet required for the practice of this invention.

Other Ingredients

The photohardenable layer may also contain other ingredients which are conventional components used in photohardenable systems subject to the conditions that they (1) must be compatible with the other ingredients present in the photohardenable layer and (2) do not alter the unique relationship of cohesive/adhesive forces between and within the unexposed photohardenable layer, the photohardenable layer exposed in the absence and in the presence of a coversheet, the elastomeric layer, and the coversheet required for the practice of this invention. Further, they must not cause the photohardenable layer to adhere more strongly to a color separation transparency than to the elastomeric layer either before or after exposure. Such components may include stabilizers, antihalation agents, optical brightening agents, release agents, surfactants, coating aids, and plasticizers.

Normally a thermal polymerization inhibitor will be present to increase storage stability of the photohardenable composition. Useful thermal stabilizers include hydroquinone, p-methoxyphenol, alkyl- and aryl-substituted hydroquinones and quinones, tert-butyl catechol, pyrogallol, beta-naphthol, 2,6-di-tert-butyl p-cresol, 2,4,6-tri-tert-butyl phenol, phenothiazine, and p-toluquinone. The dinitroso dimers described in Pazos, U.S. Pat. No. 4,168,982, may also be useful. Since monomers generally contain thermal polymerization inhibitors added by their manufacturers, it is frequently unnecessary to add additional inhibitor.

Nonionic surfactants may be added to the photohardenable layer as coating aids. Preferred coating aids are polyethylene oxide, such as Polyox ® WSRN 3000, and fluorinated nonionic surfactants, such as Fluorad ® FC-430.

By the incorporation of optical brightening agents into the photohardenable layer, the image record is produced free from distortion due to halation effects. Suitable optical brighteners useful in the process of the invention include those disclosed in U.S. Pat. Nos. 2,784,183; 3,664,394; and 3,854,950. Specific optical brighteners which are particularly useful in photohardenable elements are 2-(stibyl-4″)-(naphtho-1′,2′,4,5)-1,2,3-triazol-2″-sulfonic acid phenyl ester and 7-(4′-chloro-6′-diethylamino-1′,3′,5′-triazine-4′-yl)amino-3-phenyl coumarin. Ultraviolet radiation absorbing materials useful in the invention are also disclosed in U.S. Pat. No. 3,854,950.

Composition

The ratio of binder to monomer may vary widely, but in general should be in the range of 3:1 to 1:3. The monomer should be compatible with, and may be a solvent for, and/or have a plasticizing action on the binder. The choice and proportions of monomer and binder are made in accordance with the requirements of selective photoadhesion and hardness. In order to provide a suitable hardness, the monomer concentration is normally kept low so that the photohardenable layer coated from the composition will be sufficiently hard and nontacky.

For precolored photohardenable layers, the preferred compositions will normally contain, based on total weight of the photohardenable layer: 35–45% binder, 35–45% monomer, 1–15% colorant, 1–5% 2,4,5-triphenylimidazolyl dimer, 1–2% chain transfer agent, 0–1.0% sensitizer, and 0–15% other ingredients.

Elastomeric Layer

The elastomeric layer is a tacky or slightly soft, deformable material. For an element with good aging stability, suitable materials for the elastomeric layer should resist monomer diffusion from the photohardenable layer into the elastomeric layer. Particularly preferred materials are elastomeric polymers and mixtures thereof, which are inherently tacky at ambient temperatures. In addition, these materials must be nonmigratory into the photohardenable layer. Rubber type polymers, both natural and synthetic may be used, e.g., isobutylene; Thiokol ® A; nitrile rubbers; butyl rubber; chlorinated rubbers; polymers of butadiene and/or isoprene; poly(vinylisobutylether); random, teleblock and block copolymers of butadiene or isoprene copolymerized with styrene; neoprene; silicone elastomers, etc., in various proportions. With these materials, a stable adhesion balance between the photohardenable layer and a support for the elastomeric layer may be achieved. A preferred material for the elastomeric layer is a styrene-isoprene-styrene block copolymer.

The elastomeric layer may also include an oxidation inhibitor, preferably at a level of 0.1 to 1%. A preferred oxidation inhibitor is tetra-bis-methylene 3-(3,5-di-tert-butyl-4-hydroxyphenyl)propionate methane.

Coversheet/Support

The elements used in the process of this invention have a coversheet which is strippable, i.e., removable by peeling it apart from the rest of the element. The coversheet must be transparent to actinic radiation and must be visually transparent and colorless when the element is to used to prepare a positive overlay proof. Preferred materials for the coversheet are polymeric films, particularly polyethylene terephthalate.

In order to make the areas of the photohardenable layer exposed in contact with the coversheet adhere better to the coversheet, the coversheet's surface may be modified; for example, the topography may be altered and the polarity increased by a surface treatment such as electrostatic discharge or flame treatment. Photosensitive elements comprising electrostatic discharge treated polyethylene terephthalate film are disclosed in Buzzell, U.S. Pat. No. 4,356,253. Flame treatment of the film also will provide good photoadhesion. An air-propane flame may be used.

While the thickness of the coversheet may be varied over a wide range, films having a thickness of 0.001 inch (0.025 mm) or less are particularly preferred for the production of negative surprint proofs. Thin coversheets produce halftone dots of good roundness with sharp edges. In general, a rapid rate of coversheet stripping produces better image quality. On the other hand, the coversheet should be thick enough so that electrostatic discharge or flame treatment will not injure it and so that it may be cleanly stripped from the element without tearing. It is critical to the process of the instant invention that the coversheet remain intact and dimensionally stable so that it may be relaminated to the element. The process of the invention does not work if a sheet of coversheet-like composition, e.g., polyethylene terephthalate, not previously used as a coversheet on an element of the invention, is laminated to the imagewise exposed element.

The elastomeric layer is present on a support. The support may be any suitable film which has the necessary stiffness and dimensional stability and which exhibits proper adhesion to the elastomeric layer. Polyethylene terephthalate is preferred. For preparation of a surprint proof, a removable support is required. Silicon release treated polyethylene terephthalate is preferred for this application.

Manufacture

The described multilayer photosensitive elements may be manufactured in several different ways. For example, the photohardenable layer is coated from a solvent onto the coversheet. After the solvent has evaporated, a release film, such as polyethylene, may be temporarily placed over the coating to protect the photohardenable layer until the rest of the element is formed. The elastomeric layer is coated from an appropriate solvent over the photohardenable layer. If a release film is present on the photohardenable layer, it must be stripped off before the elastomeric layer is coated. After the solvent has evaporated, the support is laminated to the surface of the elastomeric layer. The solvent for the elastomeric layer should not have any solubilizing or deleterious effect on the photohardenable layer.

Another method is to coat the photohardenable layer onto the coversheet and to coat the elastomeric layer onto the support. After the solvent has evaporated, a release film, such as polyethylene, may be placed over the photohardenable and/or elastomeric layers for protection until the rest of the element is formed. The supported photohardenable and elastomeric layers are laminated together under pressure at room temperature or elevated temperature. If a release film is present, it must be stripped off before lamination.

The photohardenable layer and the elastomeric layer may also be coated simultaneously onto the coversheet. The support is then laminated to the elastomeric layer. Alternatively, the photohardenable layer and the elastomeric layer may be coated simultaneously onto the support. The coversheet is then laminated to the photohardenable layer. All of these methods are known to those skilled in the art of coating multilayer films.

The photohardenable layer is prepared by mixing the ingredients of the system in a solvent, such as methylene chloride, usually in the weight ratio of about 15:85 to 25:75 (solids to solvent), coating onto the appropriate support, and evaporating the solvent. Coating should be uniform. A coating weight of about 40 mg/dm$^2$, generally providing a dry thickness of about 0.004 mm is preferred. A release film, such a polyethylene, generally is placed over the coating after the solvent evaporates for protection until the rest of the element is formed.

Any suitable solvent may be used to coat the elastomeric layer. When the elastomeric layer and photohardenable layer are coated simultaneously, the solvent must not cause significant migration of the components of the elastomeric layer into the photohardenable layer. Coatings of the elastomeric layer should be uniform and typically have a thickness of 3 to 15 μm, preferably 7 to 12 μm, when dry. Dry coating weight will be about 30 to 150 mg/dm$^2$, preferably 70 to 120 mg/dm$^2$. The elastomeric layer may also be coated as a dispersion, e.g., an aqueous dispersion, with satisfactory results.

Industrial Applicability

The photosensitive processes of this invention are useful for preparing colored images. These images are particularly useful in the graphic arts field, especially in the area of color proofing, wherein proofs are prepared to duplicate the images produced by printing. As described earlier, the processes of this invention can be used to prepare precolored, positive overlay proofs as well as precolored negative surprint proofs.

The disclosure of all references cited herein is hereby incorporated by reference.

The advantageous properties of this invention can be observed by reference to the following examples which illustrate, but do not limit, the invention.

EXAMPLES

| GLOSSARY | |
|---|---|
| Black pigment | Raven ® 450; C.I. No. Pigment Black7; Cities Service Co. |
| Calcofluor ® White | 7-Diethylamino-4-methylcoumarin; |
| RWP Concentrate | 2H-1-benzopyran-2-one, 7-(diethylamino)-; CAS 71173-56-3; American Cyanamide |
| o-Cl-HABI | 1,1'-Biimidazole, 2,2'-bis [o-chlorophenyl]-4,4',5,5'-tetraphenyl-; CAS 1707-68-2 |
| Cyan pigment | Monastral ® Blue G (BT 284D); C.I. No. Pigment Blue 15; copper phthalocyanine |
| Elvacite ® 2051 | Poly(methyl methacrylate); MW = 350,000 E.I. du Pont de Nemours and Company |
| Epoxy acrylate | Methacrylate ester of the epichlorohydrin adduct of bis-phenol A |
| FC-430 | Fluorad ® FC-430, fluorinated nonionic surfactant; 3M Company; CAS 11114-17-3 |
| Irganox ® 1010 | Tetra-bis methylene 3-(3,5-di-tert-butyl-4-hydroxyphenyl) propionate methane; Ciba-Geigy |
| Kraton ® D1107 | Styrene-isoprene-styrene block copolymer (14/86); Shell Chemical Corp. |
| Magenta pigment | Monastral ® Violet R; C.I. No. Pigment Violet 19 |
| 2-MBO | 2-Mercaptobenzoxazole; 2-Benzoxazolethiol; CAS 2382-96-9 |
| Methacrylate dispersant | Elveron ® 6037; Poly(methyl methacrylate)/2-ethylhexyl acrylate - Desmodur ® N adduct; Mn = 9,000; Du Pont |
| Polyox ® WSRN 3000 | Polyethylene oxide, MW 400,000; Union Carbide |
| Tinopal ® PCR | 2-(Stibyl-4")-(naphtho-1',2',4,5)-1,2,3-triazol-2"-sulfonic acid phenyl ester; Benzenesulfonic acid, 5-(2H-naphtho<1,2-D>-triazole-2-yl)-2-(2-phenylethyl)-, phenyl ester; CAS 6994-51-0; Ciba-Geigy; Ardsley, NY |
| Uvitex ® OB | Benzoxazole, 2,2'-(2,5-thiophene-di-yl)-bis-5-(1,1-dimethylethyl); CAS 7128-64-5; Ciba-Geigy |
| Yellow Pigment | Cromophtal ® Yellow 3G; C.I. No. Pigment Yellow 93; Ciba-Geigy |

EXAMPLE 1

Examples 1-5 illustrate the use of the processes of this invention to prepare precolored positive overlay proofs from precolored photosensitive elements which are similar in composition and structure to those disclosed in Example 1 of U.S. Pat. No. 4,489,154.

The precolored photosensitive elements have the following structure: coversheet, precolored photohardenable layer, elastomeric layer, and support. The coversheet is an about 50 μm (2 mil) thick clear polyethylene terephthalate film which has been surface treated with an electric discharge of about 0.544 coulomb/m$^2$. The photohardenable layer, described below, was coated on the coversheet at a coating weight of about 40 mg/dm$^2$. The elastomeric layer is Kraton ® D1107 containing 0.5% of Irganox ® 1010, coated on the support at about 100 mg/dm$^2$. The support is an about 75 μm (3 mil) thick polyethylene terephthalate film.

To prepare the yellow precolored photosensitive element the composition in the yellow column of Table 1 was dissolved in methylene chloride (22-24% nonvolatile additives) and coated on the coversheet, and covered with a polyethylene film. The polyethylene film was removed, and the yellow photohardenable layer was laminated to the elastomeric layer, which had been previously been coated on the support.

TABLE 1

| COMPOSITION OF THE PHOTOPOLYMERIZABLE LAYER$^a$ | | | | |
|---|---|---|---|---|
| | Yellow | Magenta | Cyan | Black |
| Yellow Pigment | 9.00 | | | |
| Magenta Pigment | | 8.93 | | |
| Cyan Pigment | | | 4.37 | |
| Black Pigment | | | | 11.18 |
| Elvacite ® 2051 | 39.38 | 37.17 | 44.80 | 38.89 |
| Methacrylate dispersant | 2.25 | 4.53 | 1.46 | 5.59 |
| Epoxy methacrylate monomer | 39.85 | 39.85 | 39.85 | 37.17 |
| o-Cl HABI | 3.00 | 3.00 | 3.00 | 2.65 |
| 2-MBO | 1.72 | 1.72 | 1.72 | 1.72 |

TABLE 1-continued

COMPOSITION OF THE PHOTOPOLYMERIZABLE LAYER[a]

| | Yellow | Magenta | Cyan | Black |
|---|---|---|---|---|
| Calcoflouor ® White RWP | 2.00 | 2.00 | 2.00 | 2.00 |
| Uvitex ® OB | 2.00 | 2.00 | 2.00 | 0.00 |
| Polyox ® WSRN 3000 | 0.70 | 0.70 | 0.70 | 0.70 |
| FC-430 | 0.10 | 0.10 | 0.10 | 0.10 |

[a] in percent by weight

Step 1. The coversheet was stripped from the yellow precolored photosensitive element to produce an element consisting of: yellow photohardenable layer, elastomeric layer, and support.

Step 2. The yellow precolored photosensitive element minus the coversheet, which was produced in Step 1, was placed in a vacuum frame. A yellow half-tone positive separation transparency was placed on top of the yellow photohardenable layer with the emulsion side in contact with the photohardenable layer. A vacuum of 10–12 lb/in$^2$ (6.9–8.2×10$^5$ dynes/cm$^2$) was drawn before exposure. Irradiation was carried out through the yellow positive half-tone separation transparency. The sample was exposed for 300 sec with a 5 kw high pressure mercury vapor lamp (Violux ® 5002S, Exposure Systems Company, Bridgeport, Conn., equipped with a photopolymer bulb) about 54 inches (about 137 cm) above the sample and integrator.

Step 3. Following exposure and subsequent vacuum release the positive separation transparency was removed from the exposed element. The coversheet removed in Step 1 was relaminated to the exposed element using a Cromalin ® laminator set at 230° F. (110° C.) and a speed of 6 ft/min (3 cm/sec) so that the side which was originally in contact with the photohardenable layer was again in contact with the photohardenable layer.

Step 4. The relaminated, imagewise exposed element produced in Step 3 was placed in the vacuum frame. The maximum vacuum was drawn and the element was blanket-wise exposed for 30 sec.

Step 5. Following exposure and subsequent vacuum release the blanket-wise exposed, relaminated element produced in Step 4 was removed from the vacuum frame and placed on a vacuum easel. The clear polyethylene terephthalate coversheet was removed by peeling back at 180° ("peel-back mode") in a smooth, continuous motion at a rate of about 3500 in/min (about 150 cm/sec) to form two separate images. A positive image of the yellow positive separation transparency, i.e., a yellow positive overlay proof, was formed on the coversheet. A negative image of the yellow positive separation transparency was formed on the elastomeric layer. The yellow positive overlay proof had a tonal range of 3–95% dots on a 150 lines/in (60 lines/cm) screen.

EXAMPLES 2–4

Steps 1 to 5 of Example 1 were repeated with magenta, cyan and black precolored photosensitive elements. These precolored photosensitive elements were prepared following the same procedure described for the yellow precolored photosensitive element in Example 1 except that the compositions given in the magenta, cyan and black columns in Table 1 were used for the photohardenable layer. Each positive overlay proof had a tonal range of 3–95% dots on a 150 lines/in (60 lines/cm) screen.

EXAMPLE 5

To produce a four-color positive overlay proof, the four image-bearing polyethylene terephthalate coversheets, i.e., the four single-color positive overlay proofs, produced in Examples 1–4 were stacked in register against a background of white paper (Cromalin ® receptor stock) in the following order: white paper, yellow image, magenta image, cyan image, and black image, with the image-bearing side (bottom) of each single-color positive overlay proof facing toward the white paper.

EXAMPLE 6

This example illustrates the use of the processes of this invention to prepare single-color, two-color, three-color, and four-color precolored negative surprint proofs from precolored photosensitive elements.

The precolored photosensitive elements used to prepare precolored negative surprint proofs were identical in composition and structure to those described in Examples 1–4, with the exception that the support was removable. The removable support was a silicon release treated 25 μm (1 mil) thick polyethylene terephthalate film.

Step 1. The removable support was removed from the black precolored photosensitive element and the resulting element, minus the removable support, was laminated to a receptor sheet of Cromalin ® receptor stock to produce an element consisting of: receptor sheet, elastomeric layer, black photohardenable layer, and coversheet.

Step 2. The coversheet was removed from the laminated element produced in Step 1 to produce an element consisting of: black photohardenable layer, elastomeric layer, and receptor sheet.

Step 3. The laminated element minus the coversheet, produced in Step 2, was placed in a vacuum frame. A black half-tone negative separation transparency was placed on top of the black photohardenable layer with the emulsion side in contact with the photohardenable layer. A vacuum of 10–12 pounds/in$^2$ (6.9–8.2×10$^5$ dynes/cm$^2$) was drawn before exposure. Irradiation was carried out through the black positive half-tone separation transparency out as described in Example 1.

Step 4. Following exposure and subsequent vacuum release the negative separation transparency was removed from the exposed element. The coversheet removed in Step 2 was relaminated to the exposed element using a Cromalin ® laminator set at 230° F. (110° C.) and a speed of 6 ft/min (3 cm/sec) so that the side which was orginally in contact with the photohardenable layer was again in contact with the photohardenable layer.

Step 5. The relaminated, imagewise exposed element produced in Step 4 was placed in the vacuum frame. The maximum vacuum was drawn and the element was blanket-wise exposed for 30 sec.

Step 6. Following exposure and subsequent vacuum release the blanket-wise exposed, relaminated element produced in Step 5 was placed in a vacuum easel and the clear polyethylene terephthalate coversheet was removed as described in Example 1 to form two separate images. A positive image of the black negative separation transparency was formed on the coversheet. A negative image of the black negative separation transparency, i.e., a single-color negative surprint proof, was formed on the elastomeric layer. The black surprint proof had a tonal range of 3–95% dots on a 150 lines/in (60 lines/cm) screen.

Step 7. The removable support was removed from the yellow precolored photosensitive element and the resulting element, minus the removable support, laminated to the black image formed in Step 6 to produce a composite element consisting of: receptor sheet, elastomeric layers, imaged black photohardenable layer, elastomeric layer, yellow photohardenable layer, and coversheet.

Step 8. The coversheet was removed from the composite element produced in Step 7 to produce an element consisting of: receptor sheet, elastomeric layer, imaged black photohardenable layer, elastomeric layer, and yellow photohardenable layer.

Step 9. The composite element minus the coversheet, produced in Step 8, was placed in a vacuum frame. A yellow half-tone negative separation transparency was placed on top of the yellow photohardenable layer with the emulsion side in contact with the photohardenable layer. The separation transparency was placed in register with the previously formed black image and irradiation carried out through the yellow positive half-tone separation transparency out as described as in Example 1.

Step 10. Steps 4–6 were repeated to produce a two-color negative surprint proof.

Step 11. Using the two-color negative surprint proof produced in Step 10, Steps 7–10 were repeated with a magenta precolored photosensitive element and a magenta negative color separation transparency to produce a three-color negative surprint proof.

Step 12. Using the three-color negative surprint proof produced in Step 11, Steps 7–10 were repeated with a cyan precolored photosensitive element and a cyan negative color separation transparency to produce a four-color negative surprint proof.

CONTROL EXAMPLE A

Following the procedure of Example 1, a precolored multilayer photosensitive element was stripped of its cover sheet and imagewise exposed in a vacuum frame, except that, in Step 3, instead of the coversheet removed in Step 1, a 50 μm thick sheet of electric discharge treated polyethylene terephthalate film was laminated to the exposed element. The electric discharge treated side of the film was laminated to the photohardenable layer. When the relaminated element was peeled apart following the overall exposure step (Step 5), no image was formed on the polyethylene terephthalate film.

Surprisingly, the process of Example 1, which produces a positive overlay image on the relaminated coversheet, cannot be achieved if a similar sheet of film is substituted for the coversheet.

CONTROL EXAMPLE B

The procedure of Example 1 was followed, except that in Step 3, the coversheet removed in Step 1 was relaminated to the element with the previously outermost surface now in contact with the photohardenable layer; i.e., the coversheet was "flipped" over and then relaminated to the element. Surprisingly, no image was formed on the coversheet when the relaminated element was peeled apart following the exposure in Step 5. This demonstrates that the process of Example 1, which produces a positive overlay image on the relaminated coversheet, cannot be achieved unless the coversheet is relaminated to the element so that the side of the coversheet originally in contact with the photohardenable layer is again in contact with the photohardenable layer.

What is claimed is:

1. A process for preparing a precolored image useful in an overlay proof, said process comprising, in the stated order, the following steps:
   (A) providing a precolored, peel-apart photosensitive element comprising, in order from top to bottom:
      (1) a strippable coversheet which is transparent to actinic radiation,
      (2) a photohardenable layer comprising a colorant;
      (3) an essentially non-photosensitive elastomeric layer; and
      (4) a support sheet;
      and wherein the adhesive relationship of the photohardenable layer (2) relative to the coversheet (1) and to the elastomeric layer (3) is altered by exposure to actinic radiation, so that in the unexposed element the photohardenable layer adheres more strongly to the elastomeric layer than to the coversheet, whereas after exposure to actinic radiation, the photohardenable layer adheres more strongly to the coversheet than to the elastomeric layer;
   (B) peeling off the coversheet;
   (C) exposing the element, minus the coversheet, to actinic radiation in an imagewise manner;
   (D) laminating the coversheet to the exposed element so that the side of the coversheet originally in contact with the photohardenable layer is again in contact with the photohardenable layer;
   (E) exposing the element overall to actinic radiation; and
   (F) peeling off the coversheet, whereby the areas of the photohardenable layer exposed in step (C) remain on the elastomeric layer and the areas of the photohardenable layer not exposed in step (C) remain on the coversheet.

2. A process of claim 1, wherein the imagewise exposure is carried out using a color separation transparency corresponding to the color of the precolored element.

3. A process of claim 2, wherein steps (A) to (F) are carried out two or more times, each time providing an element precolored with a different color and each time exposing the element through its corresponding color separation transparency, to form a like number of precolored images on transparent coversheets, and wherein such images are stacked in register to produce a multicolor overlay proof.

4. A process of claim 3, wherein steps (A) to (F) are carried out four times, using precolored photosensitive elements colored yellow, magenta, cyan, and black.

5. A process of claim 1, wherein the imagewise exposure is through a positive image-bearing transparency to form a positive image on the coversheet.

6. A process of claim 3, wherein each imagewise exposure is through a positive color-separation transparency and wherein a positive multicolor overlay proof is formed.

7. A process of claim 1, wherein the photohardenable layer is photopolymerizable, comprising a polymeric binder; an addition polymerizable, ethylenically unsaturated monomer; and an initiator system activatable by actinic radiation.

8. A process of claim 7, wherein the photopolymerizable layer comprises about 35-45% polymeric binder, 35-45% monomer, 1-15% colorant, 2-8% initiator system, and 0-15% other ingredients.

9. A process of claim 7, wherein the coversheet is electric discharge treated polyethylene terephthalate film.

10. A process for preparing a precolored image useful in a pre-press surprint color proof, said process comprising, in the stated order, the following steps:
(A) providing a precolored, peel-apart photosenstive element comprising, in order from top to bottom:
(1) a strippable coversheet which is transparent to actinic radiation,
(2) a photohardenable layer comprising a colorant;
(3) an essentially non-photosensitive elastomeric layer; and
(4) a removable support sheet;
and wherein the adhesive relationship of the photohardenable layer (2) relative to the coversheet (1) and to the elastomeric layer (3) is altered by exposure to actinic radiation, so that in the unexposed element the photohardenable layer adheres more strongly to the elastomeric layer than to the coversheet, whereas after exposure to actinic radiation, the photohardenable layer adheres more strongly to the coversheet than to the elastomeric layer;
(B) removing the removable support sheet and adhering the element, minus the removable support, to a receptor sheet (5);
(C) peeling off the coversheet;
(D) exposing the element, comprising the photohardenable layer (2), the elastomeric layer (3), and the receptor (5), to actinic radiation in an imagewise manner;
(E) laminating the coversheet to the photohardenable layer of the exposed element so that the side of the coversheet originally in contact with the photohardenable layer is again in contact with the photohardenable layer;
(F) exposing the element overall to actinic radiation; and
(G) peeling the strippable coversheet from the photohardenable layer, whereby the material in the areas of the photohardenable layer imagewise exposed in step (D) remain on the elastomeric layer, and the material in the areas of the photohardenable layer not exposed in step (D) remain on the coversheet.

11. A process of claim 10, wherein the imagewise exposure is carried out using a color-separation transparency corresponding to the color of the precolored element.

12. A process of claim 11, additionally comprising the steps of:
(H) removing the removable support sheet from an additional, differently colored, photosensitive element, and adhering the element, minus the support sheet, to the image formed on the elastomeric layer in Step (G);
(I) removing the coversheet;
(J) exposing the element to actinic radiation through its corresponding color-separation transparency;
(K) relaminating the coversheet to the exposed element so that the side of the coversheet originally in contact with the photohardenable layer is again in contact with the photohardenable layer;
(L) blanket-wise exposing the element to actinic radiation;
(M) peeling the strippable coversheet from the photohardenable layer, whereby the material of the photohardenable layer in the areas exposed in step (J) remains on the elastomeric layer as a negative image of the transparency used, and the material in the areas not exposed in step (J) remains on the coversheet as a positive image of the transparency used, and
(N) carrying out steps (H) to (M) one or more times, each time with a differently precolored element, and each time exposing through a corresponding color-separation transparency, to form a multicolored surprint proof.

13. A process of claim 12, wherein the precolored photosensitive elements are colored yellow, magenta, cyan, and black.

14. A process of claim 12, wherein each imagewise exposure is through a negative color-separation transparency to form a negative surprint proof.

15. A process of claim 10, wherein the photohardenable layer is photopolymerizable, comprising a polymeric binder; an addition polymerizable, ethylenically unsaturated monomer; and an initiator system activatable by actinic radiation.

16. A process of claim 15, wherein the photopolymerizable layer comprises about 35-45% polymeric binder, 35-45% monomer, 1-15% colorant, 2-8% initiator system, and 0-15% other ingredients.

17. A process of claim 15, wherein the coversheet is electric discharge treated polyethylene terephthalate film.

* * * * *